US007655955B2

(12) United States Patent
Jung (10) Patent No.: US 7,655,955 B2
(45) Date of Patent: Feb. 2, 2010

(54) LIGHT EMITTING DEVICE AND BACKLIGHT UNIT USING THE SAME AS LIGHT SOURCE AND FIELD SEQUENTIAL LCD APPARATUS EMPLOYING THE BACKLIGHT UNIT

(75) Inventor: Il-yong Jung, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 65 days.

(21) Appl. No.: 11/591,524

(22) Filed: Nov. 2, 2006

(65) Prior Publication Data

US 2007/0097705 A1   May 3, 2007

(30) Foreign Application Priority Data

Nov. 2, 2005   (KR) .................. 10-2005-0104153

(51) Int. Cl.
*H01L 33/00*   (2006.01)
(52) U.S. Cl. .................. 257/98; 257/99; 257/100; 257/E33.072; 257/E33.073

(58) Field of Classification Search .......... 257/98–100, 257/E33.06, E33.072, E33.073; 349/61, 349/64, 65
See application file for complete search history.

(56) References Cited

U.S. PATENT DOCUMENTS

| 6,502,956 B1 | 1/2003 | Wu |
| 2005/0105929 A1 | 5/2005 | Chae et al. |
| 2007/0257272 A1* | 11/2007 | Hutchins ............. 257/98 |

FOREIGN PATENT DOCUMENTS

| KR | 2000-0030723 A | 6/2000 |
| KR | 10-2003-0081727 A | 10/2003 |
| KR | 10-2004-0084976 A | 10/2004 |
| KR | 10-2005-0022820 A | 3/2005 |
| KR | 10-2005-0069009 A | 7/2005 |

* cited by examiner

*Primary Examiner*—Minh-Loan T Tran
(74) *Attorney, Agent, or Firm*—Sughrue Mion, PLLC (57) ABSTRACT

A light emitting device includes a light emitting element chip and a lens which transmits light generated by the light emitting device asymmetrically; a backlight unit which uses the light emitting device as a light source; and a field sequential LCD apparatus adopting the backlight unit.

20 Claims, 7 Drawing Sheets

LIGHT EMITTING DEVICE AND BACKLIGHT UNIT USING THE SAME AS LIGHT SOURCE AND FIELD SEQUENTIAL LCD APPARATUS EMPLOYING THE BACKLIGHT UNIT

CROSS-REFERENCE TO RELATED PATENT APPLICATIONS

This application claims the benefit of Korean Patent Application No. 10-2005-0104153, filed on Nov. 2, 2005, in the Korean Intellectual Property Office, the disclosure of which is incorporated herein in its entirety by reference.

BACKGROUND OF THE INVENTION

1. Field of the Invention

Apparatuses consistent with the present invention relate to a light emitting device, a backlight unit using the light emitting device as a light source, and a liquid crystal display (LCD) apparatus adopting the backlight unit, and more particularly, to a light emitting device which emits light asymmetrically, and a direct light type backlight unit that can individually light in units of domains which use a plurality of the light emitting devices as the light source, and an LCD apparatus including the direct light type backlight unit.

2. Description of the Related Art

Liquid crystal display (LCD) apparatuses are light receiving type flat panel display apparatuses that do not generate light by themselves, but instead use external light to display images. A backlight unit is typically installed at the rear of an LCD apparatus to provide a light source for the LCD apparatus.

Cold cathode fluorescence lamps (CCFL) are mainly used as the light source for the backlight unit in LCD apparatuses. However, a CCFL has a relatively short life span, and low color reproducibility. CCFLs have much shorter life spans and lower color reproducibility than light emitting diodes (LED), and have lower instantaneous lighting performances than LEDs.

Therefore, it is difficult to perform lighting with short response times using the CCFL, and thus, it is difficult to use backlight units using CCFLs as the light sources of field sequential LCD apparatuses. A field sequential LCD apparatus requires a backlight unit that can sectionally light in synchronization with screen scanning time. A backlight unit using LEDs as the light source can satisfy the above requirement.

In addition, backlight units can be direct light type backlight units, in which a plurality of light sources installed below the LCD apparatus irradiate the light towards the liquid crystal panel, or edge light type backlight units, in which the light emitted from the light source installed on a side wall of a light guide panel (LGP) is irradiated to the liquid crystal panel, according to the arrangement of light sources.

Direct light type backlight units may use LEDs as point light sources. In backlight units using LEDs as point light sources, the LEDs are arranged in two-dimensional arrays. In particular, the LEDs are arranged to form a plurality of LED lines, and a plurality of LEDs are disposed in each of the lines.

Direct light type backlight units that use LEDs as the light source can be used in field sequential LCD apparatuses.

In field sequential LCD apparatuses using the direct light type backlight unit that uses LEDs as light sources, lighting regions of the LEDs are sectioned into a plurality of domains, and the LEDs light according to a lighting region unit in synchronization with scanning times of the liquid crystal panel. Since red (R), green (G), and blue (B) LEDs are arranged in each of the lighting regions for realizing a color image, the direct light type backlight unit separately operates by the lighting region unit and the color unit to display the RGB colors without using sub-pixels of the liquid crystal panel.

Therefore, the field sequential LCD apparatus does not use a color filter, and thus, original colored light generated by the LEDs can be used without further color modification, and color representation can be improved. However, the above field sequential LCD apparatus has following disadvantages.

In the field sequential method, the LEDs light after the liquid crystal response, and thus, if the R, G, and B color images are displayed sequentially on the screen, when the R image is displayed, the B color of the previous sub-frame is mixed with the R color. For example, when the liquid crystal on a first domain, that is, on the first line, responds before operating the R LED in order to display an R color image, the B light emitted from the B LED that operates on the last domain of the previous sub-frame, that is, the last line of the previous sub-frame, may reach the liquid crystal of the first line. Therefore, some of the B light may be transmitted to the liquid crystal responding in the first domain. When G images and B images are displayed, they are also affected by the above problem.

Therefore, due to the color mixture, color reproducibility of the image as a whole produced by the display apparatus is degraded, and color uniformity is also degraded.

SUMMARY OF THE INVENTION

Exemplary embodiments of the present invention provide a light emitting device, which can reduce degradation of color reproducibility due to color spreading between domains and can remove a color unevenness over an entire screen, when it is used as a light source of a direct light type backlight unit in a field sequential liquid crystal display (LCD) apparatus, a direct light type backlight unit capable of lighting of regions sequentially by using the light emitting device as a light source, and a field sequential LCD apparatus using the direct light type backlight unit.

According to an exemplary aspect of the present invention, there is provided a light emitting device including: a light emitting element chip; and a lens which asymmetrically transmits light generated by the light emitting element chip.

The lens may comprise a reflective region, which reflects incident light, disposed on at least a portion of an outer surface of the lens, wherein the reflective region is located on a side of a reference plane including a central axis of the light emitting element chip and the lens, and thereby asymmetrically transmits the light generated by the light emitting element chip.

The reflective region may be disposed on half of the outer surface of the lens that is located on one side of the reference plane.

The reflective region may have a reflectivity gradient.

The reflective region may have a larger reflectivity at portions of the reflective region further from the reference plane, as compared to portions of the reflective region closer to the reference plane.

The reflective region comprises a reflective pattern coated on the surface of the lens, and the reflective pattern may be denser on portions of the surface of the lens farther from the reference plane, as compared to portions of the surface of the lens closer to the reference plane, thereby forming the reflectivity gradient.

The lens may comprise an asymetric region disposed on at least a portion of the outer surface of the lens, which is located on a side of reference plane including a central axis of the light emitting element chip and the lens, and therein the asymmetric region asymmetrically transmits the light generated by the light emitting element chip.

The asymmetric region of the lens may comprise one of a planar surface inclined with respect to the reference plane, a conical surface, a convex surface inclined with respect to the reference plane, a convex conical surface, a concave surface inclined with respect to the reference plane, and a concave conical surface, such that most of the light incident from the light emitting element is internally reflected or refracted by the asymmetric region toward the reference plane or toward a central axis thereof.

An angle of the conical surface, of the planar surface, of the convex surface, or of the concave surface with respect to the central axis or with respect to the reference plane may be smaller than 45°.

A region of the outer surface of the lens other than the asymmetric region may comprise one of a convex curved surface and a conical surface, curved around the central axis.

According to another exemplary aspect of the present invention, there is provided a backlight unit including: a base substrate; a plurality of point light sources arranged on the base substrate; and a transmission and diffusion plate, disposed on the plurality point light sources, which diffuses and transmits incident light. Each of the plurality of light emitting devices may comprise: a light emitting element chip; and a lens which asymmetrically transmits light generated by the light emitting element chip, which prevents light emitted from the light emitting element chip from proceeding in a predetermined direction.

The plurality of point light sources arranged on the base substrate are divided into domain regions, wherein each of the domain regions may include a single light emitting element chip which emits one of red, green, and blue light.

Each domain region may comprise a line of point light sources.

According to another exemplary aspect of the present invention, there is provided a field sequential display apparatus including: a display panel; and a backlight unit, installed on a rear of the display panel, which irradiates light onto the display panel.

The display panel may be a liquid crystal panel.

BRIEF DESCRIPTION OF THE DRAWINGS

The above and other exemplary aspects of the present invention will become more apparent by the following detailed description of exemplary embodiments thereof with reference to the attached drawings in which.

DETAILED DESCRIPTION OF EXEMPLARY EMBODIMENTS OF THE INVENTION

Hereinafter, a light emitting device (LED), a field sequential direct light type backlight unit using the LED as a light source, and a field sequential liquid crystal display (LCD) apparatus adopting the backlight unit will be described with reference to accompanying drawings.

In a field sequential LCD apparatus such as an LCD TV, an image for one frame is sequentially scanned from an upper portion of a liquid crystal panel to a lower portion of the liquid crystal panel, and an image of a next frame starts to be scanned right before the scanning of the lower portion of the image is finished.

Therefore, in a backlight unit of the field sequential LCD apparatus, a plurality of domains, for example, lines, on which a plurality of point light sources are arranged, need to sequentially and sectionally light at a predetermined time interval in synchronization of with the scanning processes of the liquid crystal panel.

As described above, when the backlight unit sequentially and sectionally lights the light sources by units of domains unit and red (R), green (G), and blue (B) colors can be represented without using sub-pixels of the liquid crystal panel. The sequential operation of domains in the a field sequential LCD apparatus is realized as illustrated in FIG. 1.

Figure 1:
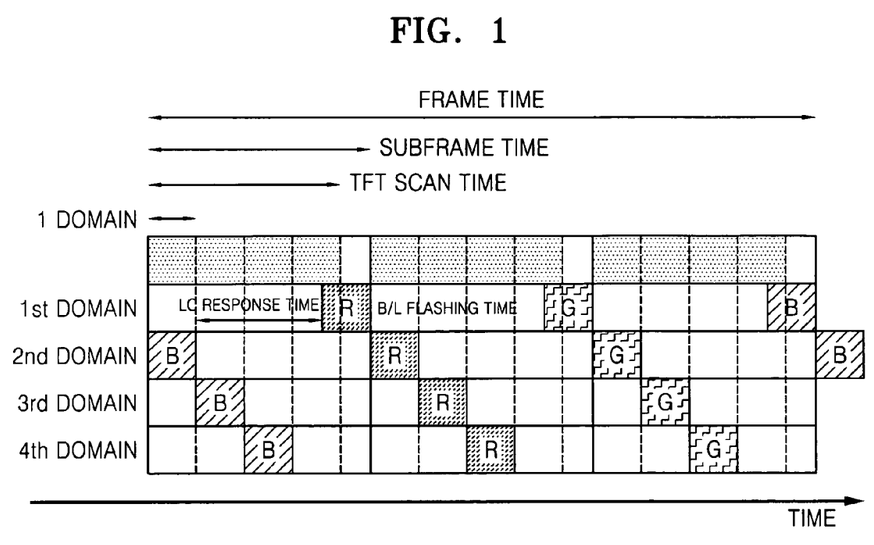
FIG. 1 is a diagram illustrating an example of operation sequence in a field sequential liquid crystal display (LCD) apparatus.

FIG. 1 illustrates an example of operation sequence of domains in a field sequential LCD apparatus. In FIG. 1, the horizontal axis denotes time.

Referring to FIG. 1, one frame includes a sub-frame displaying an R image by operation sequence, a sub-frame displaying a G image by operation sequence, and a sub-frame displaying a B image by operation sequence. Here, domains are sequentially operated from upper domain to lower domain of the LCD apparatus to display the R, G, and B images.

In the field sequential LCD apparatus, the light source is turned on after the liquid crystal has responded. In FIG. 1, TFT scan time is the time taken for inputting an image signal into a predetermined domain to drive the liquid crystal, LC response time is a response time of the liquid crystal, and B/L flashing time is the length of time the backlight unit is flashed for. As shown in FIG. 1, the backlight unit is flashed after a predetermined time (at least the LC response time) has elapsed since the signal is input into the liquid crystal on a predetermined domain.

Figure 2:
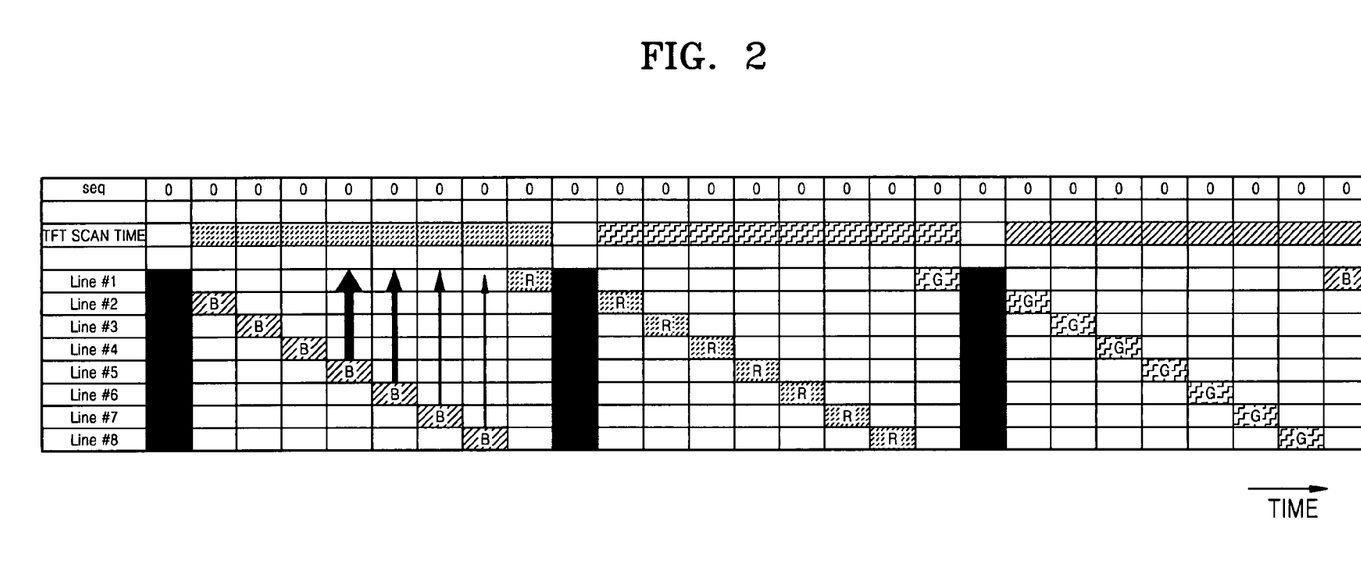
FIG. 2 is a diagram explaining a color spread in the field sequential LCD apparatus.

Therefore, as shown in FIG. 2, when the LCD apparatus is sequentially operated from the upper domains to the lower domains in line unit, and the color images are displayed in an order of R, G, and B colors, for example, during the liquid crystal response before R light is emitted from the backlight in a first line (Line #1) of the following R sub-frame, B light is emitted from the backlight in at least one last line (Line #8) of the previous B sub-frame.

When the B color backlight widely spreads toward the upper and lower portions of the screen, the light can be transmitted to the first line (Line #1) of the next sub-frame, which starts to display the image of different color. Therefore, when the R color image is displayed on the screen, the B color of the previous sub-frame may be mixed with the R color, and thus, R image mixed with the B color is displayed on the screen.

Likewise, during the liquid crystal response before G light is emitted from the backlight in a first line (Line #1) of the following G sub-frame, R light is emitted from the backlight in at least one last line (Line #8) of the previous R sub-frame. In addition, during the liquid crystal response before B light is emitted from the backlight from the first line (Line #1) of the following B sub-frame, G light is emitted from the backlight in at least one last line (Line #8) of the previous G sub-frame. Therefore, a G color image mixed with the R color, and a B color image mixed with the G color are displayed on the screen.

However, when the light emitting device, according to an embodiment of the present invention that includes a light emitting element chip and a lens transmitting the light from the light emitting element chip asymmetrically, is used as the light source of the backlight unit in the field sequential LCD apparatus, the light emitted from the light emitting device located in a predetermined domain is not transmitted to the domains previously operated in the same frame (or sub-frame).

For example, when a light emitting device according to an embodiment of the present invention is used, during the liquid crystal response before R light is emitted from the first domain of the R sub-frame, even when B light is emitted in the at least one last domain of the previous B sub-frame, the B light is not transmitted to the first domain of the next R sub-frame that represents the image of different color (in this case R color). Therefore, a pure R color image that is not mixed with the B color can be displayed on the screen. Likewise, a pure G image that is not mixed with the R color and a pure B color image that is not mixed with the G color can be displayed on the screen.

As described above, when the light emitting device including the lens for transmitting the light from the light emitting element asymmetrically is used as the light source of the backlight unit, color mixture generated due to the dispersion of colored light does not occur.

Hereinafter, light emitting devices according to embodiments of the present invention will be described as follows.

Figure 3:
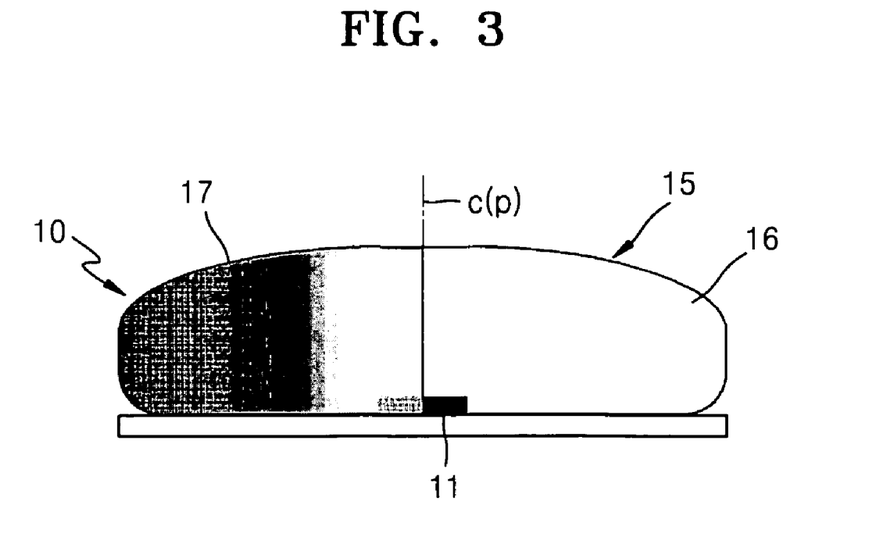
FIG. 3 is a schematic side view of a light emitting device according to an exemplary embodiment of the present invention.
Figure 4:
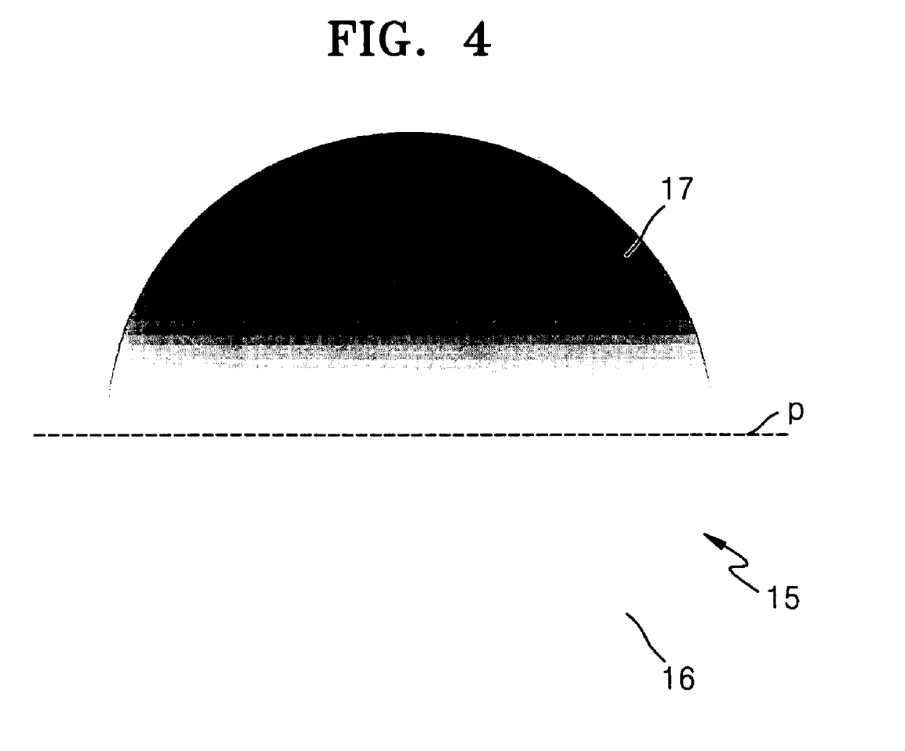
FIG. 4 is a plan view of a lens of the light emitting device of FIG. 3.

FIG. 3 is a schematic side view of a light emitting device according to an embodiment of the present invention, and FIG. 4 is a plan view of a lens of the light emitting device of FIG. 3.

Referring to FIGS. 3 and 4, a light emitting device 10 according to an embodiment of the present invention includes a light emitting element chip 11, and a lens 15 for transmitting the light from the light emitting element chip 11 asymmetrically.

A chip of an organic light emitting diode (OLED) or a light emitting diode (LED) emitting diverging light can be used as the light emitting element chip 11.

According to the present embodiment, the lens 15 includes a reflective region 17 on a part of an outer surface thereof that is located on a side of a reference plane (p) including the central axis (c) of the light emitting element chip 11 and the lens 15, so that the light emitted from the light emitting element chip 11 can exit asymmetrically. The other region of the outer surface of the lens 15 other than the reflective region 17 is a light transmission region 16 that refracts and transmits the light.

The reference plane p in the detailed description of the invention and claims denotes a plane used as a reference for illustrating the reflective region 17 formed on the lens 15 of the light emitting device 10 and a reflectivity feature of the reflective region 17 formed to have reflectivity gradient. The central axis (c) of the light emitting element chip 11 and the lens 15 are located on the reference plane p in parallel to the reference plane p. The reference plane p may be parallel to a line obtained by arranging the plurality of light emitting devices 10 in the backlight unit that will be described later, and may be perpendicular to a scan direction of the LCD apparatus, that is, a direction from the upper screen to the lower screen of the apparatus that will be described later. The lens 15 in the light emitting device 10 of the present embodiment can be described in various ways instead of using the reference plane p.

The reflective region 17 can be formed on a half portion of the outer surface of the lens 15 that is one side of the reference plane p.

The reflective region 17 may be formed to have a reflectivity gradient. In more detail, area of the reflective region 17 of the lens 15 further from the reference plane p has larger reflectivity.

In a case where the reflective region 17 has the above reflectivity gradient, the portion of the reflective region 17 having the largest reflectivity is the farthest portion on the outer surface of the lens 15 from the reference plane p.

Figure 5:
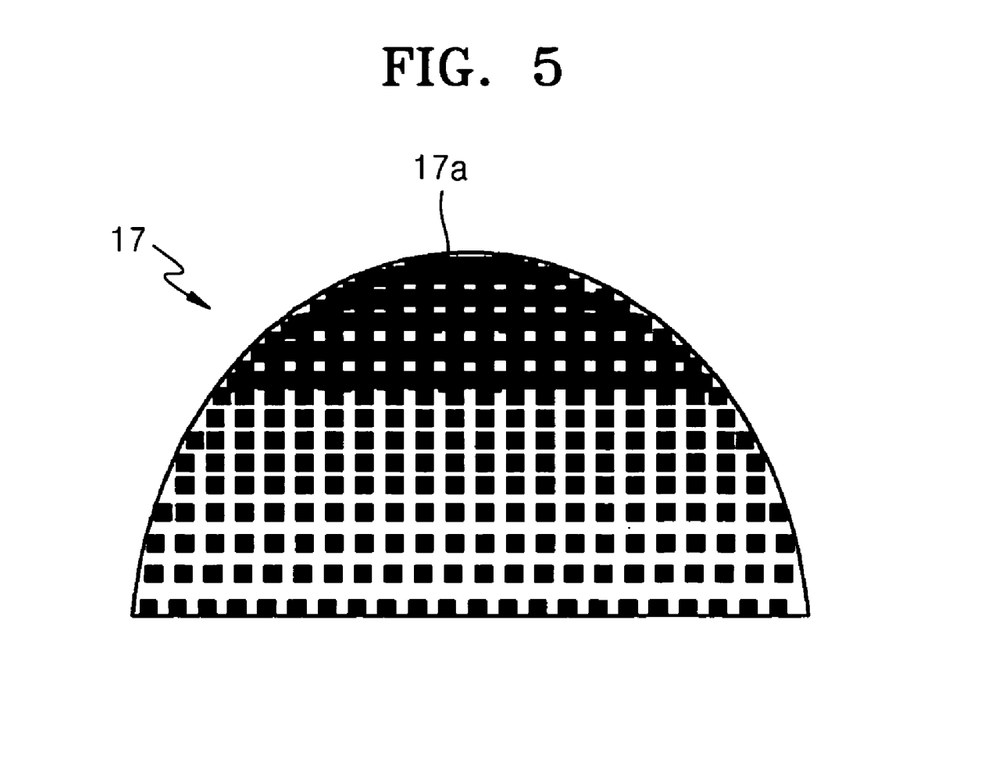
FIG. 5 is a view illustrating an example of a reflective region of the lens of FIG. 3, that is, the reflective region on an outer surface of the lens formed by coating a reflective pattern according to an embodiment of the present invention.

The reflective region 17 having the above reflectivity gradient can be formed by coating the outer surface of the lens 15 with a reflective pattern 17a as shown in FIG. 5. The reflective pattern 17a is formed to be dense on the portion far from the reference plane p, and to be sparse on the portion close to the reference plane p. FIG. 5 is a diagram of the reflective region 17 which is formed by coating the reflective pattern 17a on the outer surface of the lens 15.

In FIGS. 3 through 5, the outer surface of the lens 15 is formed as a convex curve based on the central axis, and the reflective region 17 having the reflectivity gradient which area of the reflective region 17 further from the reference plane P has larger reflectivity is formed on one half of the outer surface of the lens 15, that is, the lens 15 of FIGS. 3 through 5 is a half-covered lens.

Figure 6:
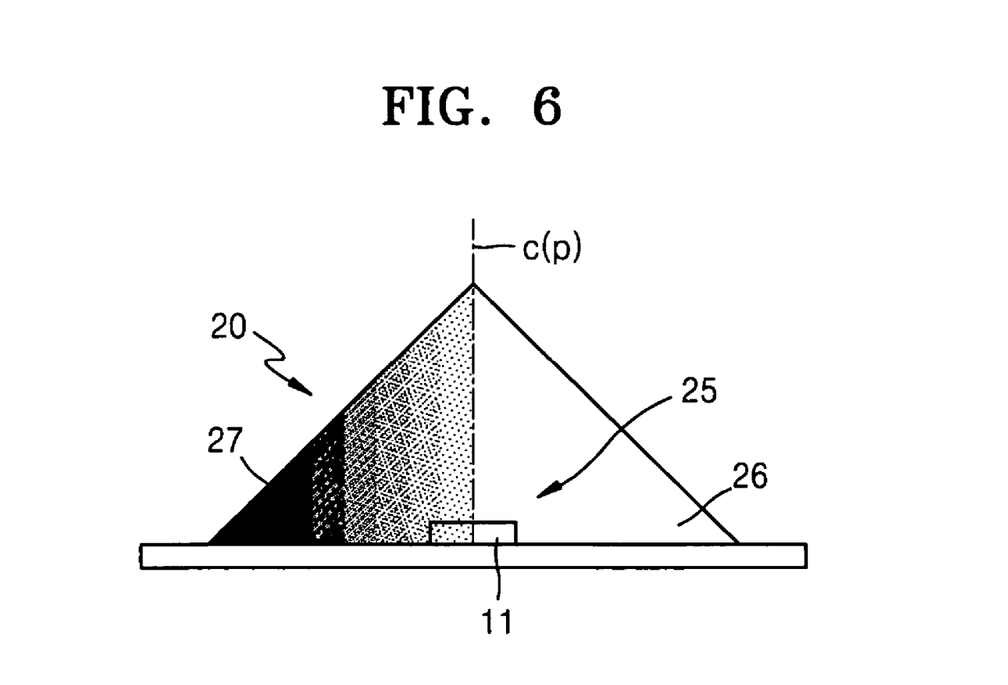
FIG. 6 is a view of a light emitting device according to another exemplary embodiment of the present invention.

FIG. 6 illustrates a light emitting device 20 according to another embodiment of the present invention. Comparing the light emitting devices 10 and 20 of FIG. 3 and FIG. 6 to each other, the light emitting device 20 of the present embodiment has a lens 25 having a conical shape that is symmetrically formed around an axis. In this case, a reflective region 27 having a reflectivity gradient is formed on a half portion of the outer surface of the conical lens 25 so that the reflectivity is larger for the portions of the reflective region 27 on the lens 25 further from the reference plane p. The other portion of the outer surface of the lens 25 other than the reflective region 27 is light transmission region 26 that refracts and transmits the light.

When the reflective region 17 or 27 is formed on the lens 15 or 25, at least some of the light emitted toward the reflective region 17 or 27 is not transmitted. Therefore, the light does not exit through the reflective region 17 or 27 of the light emitting device 10 or 20, or the amount of the light emitted from the reflective region 17 or 27 is smaller than the amount of light emitted from the other portion, that is, the transmission region 16 or 26, and thus, the light is asymmetrically emitted.

When an LCD apparatus including the backlight unit that uses the light emitting device 10 or 20 of the present invention as the light source is sequentially driven from the upper portion of the screen to the lower portion of the screen, the reflective region 17 or 27 is formed on the outer surface of the lens 15 or 25 which faces the upper portion of the screen with respect to the reference plane p. In addition, when the LCD apparatus is formed to emit the light sequentially from the lower portion of the screen to the upper portion of the screen, the reflective region 17 or 27 is formed on the outer surface of the lens 15 or 25 which faces the lower portion of the screen with respect to the reference plane p.

When the light emitting device 10 or 20, including the reflective region 17 or 27, is used as the light source of the backlight unit in an LCD apparatus, the light emitted from the light emitting device 10 or 20 that corresponds to a predetermined domain of the backlight unit is not transmitted to the previously operated domain in the same frame (or the sub-frame).

In particular, when the reflective region 17 or 27 of the lens 15 or 25 has a reflectivity gradient, that is, the reflectivity is larger for the portion of the reflective region 17 or 27 of the lens 15 or 25 further from the reference plane p, light transmitting in a direction capable of transmitting to a distance can be further reflected so that the proceeding of the light is further effectively cut. Therefore, transmission of the light emitted from the light emitting device 10 or 20 located on a predetermined domain toward the previously operated domain in the same frame can be shielded effectively.

Therefore, according to the LCD apparatus adopting the backlight unit that uses the light emitting device 10 or 20 of the present invention as the light source, if it is assumed that the color images are displayed in an order of R, G, and B images in one frame and the R color is operated sequentially from the upper portion of the screen toward the lower portion of the screen, B light emitted at lower portions of the screen in previous sub-frame do not affect the upper domains even if the B light of the previous sub-frame is emitted at the lower portion of the screen before R light is emitted from the backlight from the first line (Line #1). Thus, the color mixture generated due to the dispersion of colored light, that is, the R color image mixed with the some B color, does not occur. Likewise, in cases where G color is sequentially operated or B color is sequentially operated, the color mixture, that is, the G color image mixed with the R color or the B color image mixed with the G color, does not occur.

In the above embodiments, the light is asymmetrically emitted due to the formation of the reflective region 17 or 27 on a half portion of the outer surface of the lens 15 or 25 of the light emitting device 10 or 20. However, the lens can be formed to have an asymmetric shape as shown in FIGS. 7A through 7C in order to transmit the light asymmetrically for preventing the color mixture instead of forming the reflective region 17 or 27.

Figure 7A:
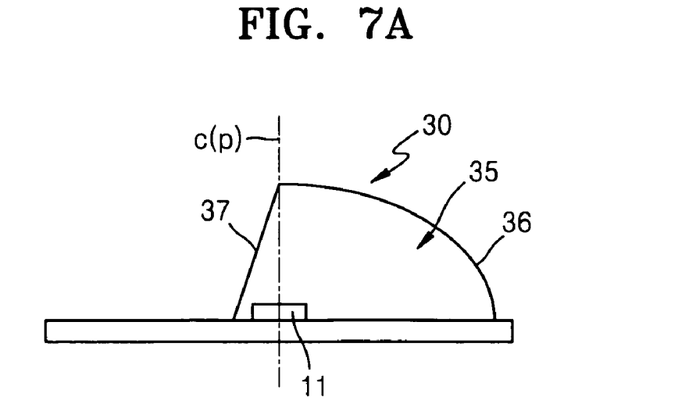
FIG. 7A is a cross-sectional view of a light emitting device according to another exemplary embodiment of the present invention when an asymmetric region of the lens is formed to have planar surface slanted to a reference plane or the shape of planar conical surface.
Figure 7B:
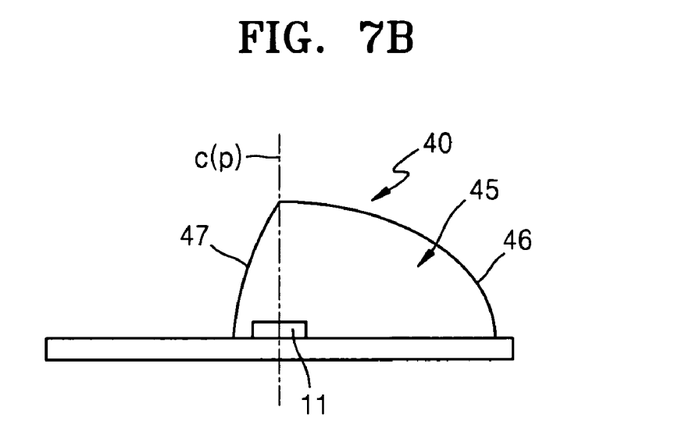
FIG. 7B is a cross-sectional view of a light emitting device according to another exemplary embodiment of the present invention when an asymmetric region of the lens is formed to have some convex surface slanted to a reference plane or the shape of some convex conical surface centered on a central axis.
Figure 7C:
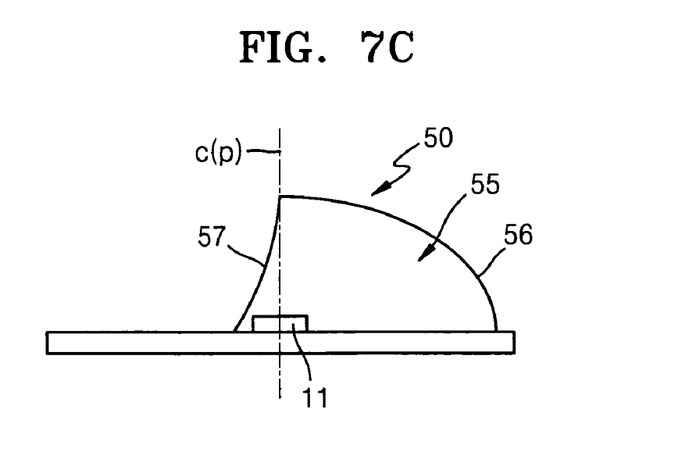
FIG. 7C is a cross-sectional view of a light emitting device according to another exemplary embodiment of the present invention when an asymmetric region of the lens is formed to have some concave surface slanted to a reference plane or the shape of some concave conical surface centered on a central axis.

FIGS. 7A through 7C are cross-sectional views of light emitting devices 30, 40, and 50 according to other embodiments of the present invention having various asymmetrical outer surfaces. Referring to FIGS. 7A through 7C, in the light emitting devices 30, 40, and 50, at least a part of an outer surface of a lens 35, 45, or 55, located at a side of the reference plane p including a center axis (c) of the light emitting element chip 11 and the lens 35, 45, or 55, is asymmetrically formed with respect to the opposite outer surface to form an asymmetric region 37, 47, or 57. The asymmetric region 37, 47, or 57 of the lens 35, 45, or 55 can be formed to have any one shape of a plane surface slanted to the reference plane p, a conical plane surface, a slightly convex surface slanted to the reference plane p, a slightly convex-conical surface, a slightly concave surface slanted to the reference plane p, and a slightly concave-conical surface, in order to internally reflect or refract most of the light emitted from the light emitting element chip 11 toward the reference plane p or to the central axis c.

Referring to FIGS. 7A through 7C, other region 36, 46, or 56 (hereinafter, symmetric region for convenience) of the outer surface of the lens 35, 45, or 55, opposite to the asymmetric region 37, 47, or 57, can be formed to have a curved surface shape.

FIG. 7A is a cross-sectional view of a light emitting device 30 according to another embodiment of the present invention, when the asymmetric region 37 of the lens 35 is formed to have a shape of a conical plane surface or a plane surface slanted toward the reference plane P.

Referring to FIG. 7A, the lens 35 can have a symmetric region 36 formed to have a curved surface in half portion of the lens 35 with respect to the reference plane P, and can have an asymmetric region 37 formed to have the conical plane surface, or the surface slanted to the reference plane P, in the other half portion of the lens 35. Here, the conical plane surface is symmetrically formed with respect to the central axis c.

Since the light emitted from the light emitting element chip 11 disperses in all directions, when the asymmetric region 37 is formed to have a conical surface or slanted surface, an angle of the conical surface with respect to the central axis c or an angle of the inclined surface with respect to the reference plane p may be less than 45°, in order to satisfy total internal reflection conditions for a large amount of light to improve the inner reflectivity of the light emitted from the light emitting element chip 11 and incident into the conical surface or the inclined surface, and in order to internally reflect the light toward the reference plane p or the central axis c so that the majority of the light can exit through the symmetric region 36.

FIG. 7B is a cross-sectional view of a light emitting device 40 according to another embodiment of the present invention, when the asymmetric region 47 of the lens 45 is formed to have the shape of a slightly convex surface slanted to the reference plane P or a slightly convex-conical surface with respect to the central axis C. FIG. 7C is a cross-sectional view of the light emitting device 50 according to another embodiment of the present invention, when the asymmetric region 57 of the lens 55 is formed to have the shape of a slightly concave surface slanted to the reference plane P or a slightly concave conical surface with respect to the central axis C. In FIGS. 7B and 7C, the angle of the slightly convex or concave conical surface with respect to the central axis c or the angle of the slightly convex or concave inclined surface with respect to the reference plane p may be less than 45° like in FIG. 7A.

FIGS. 7A through 7C illustrate the lens 35, 45, or 55 having the symmetric region 36, 46, or 56 formed on a portion of the outer surface of the lens 35, 45, or 55 to be curved around the central axis c, and the asymmetric region 37, 47, or 57 formed on the other half portion of the lens 35, 45, or 55 for emitting the light asymmetrically.

Alternatively, the asymmetric region can be formed on a part of a half portion of the lens 35, 45, or 55, wherein the asymmetric region may be formed on a part of a half portion that is apart from the reference plane p. 84

The asymmetric region 37, 47, or 57 of the lens 35, 45, or 55 of FIGS. 7A through 7C can be coated with a reflective material in order to increase the ratio of the light that is emitted through the symmetric region 36, 46, or 56.

In FIGS. 7A through 7C, the region of the lens 35, 45, or 55 other than the asymmetric region 37, 47, or 57, that is, the symmetric region 36, 46, or 56, is formed having a curved surface with respect to the central axis c. However, the symmetric region 36, 46, or 56 can be formed as a conical shape with respect to the central axis c, as shown in FIG. 6. Here, since as much light as possible should be refracted and transmitted through the symmetric region, the angle of the conical surface of the symmetric region with respect to the central axis may be larger than 45° so that total internal reflection of the light does not occur. The shape of the lens in this case can be estimated from the lenses shown in FIGS. 6 and 7A through 7C, and thus, detailed description of the lens is omitted.

The asymmetric regions 37, 47, and 57 of the lenses 35, 45, and 55 can be formed in various shapes besides the above embodiments. The various modifications of the asymmetric region can be estimated from the above description and the accompanying drawings, and thus, detailed descriptions of the modifications will be omitted.

Figure 8:
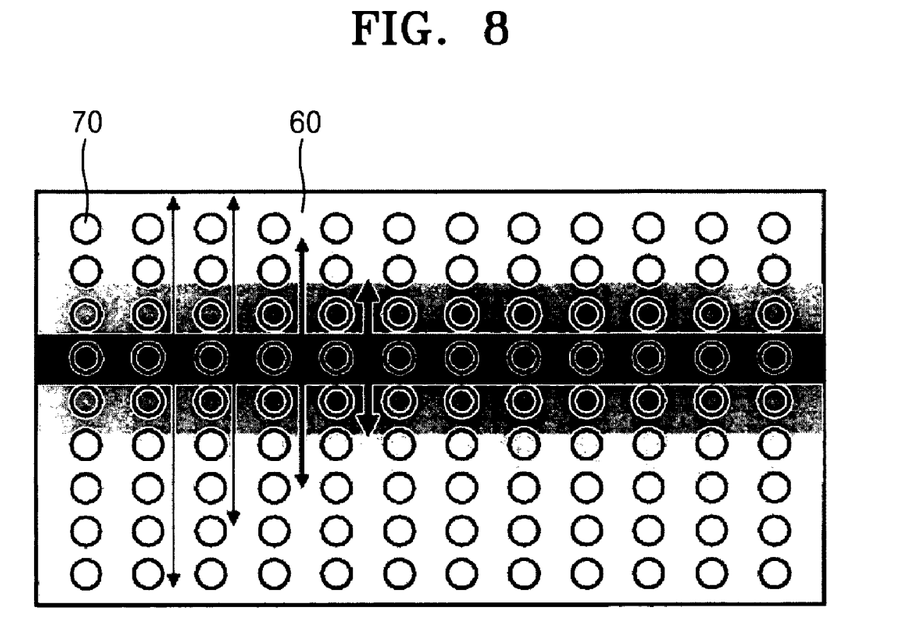
FIG. 8 is a diagram illustrating a spreading range of the light emitted from lighted LEDs in a predetermined line when a general LED is used as a point light source in a direct light type backlight unit.
Figure 9:
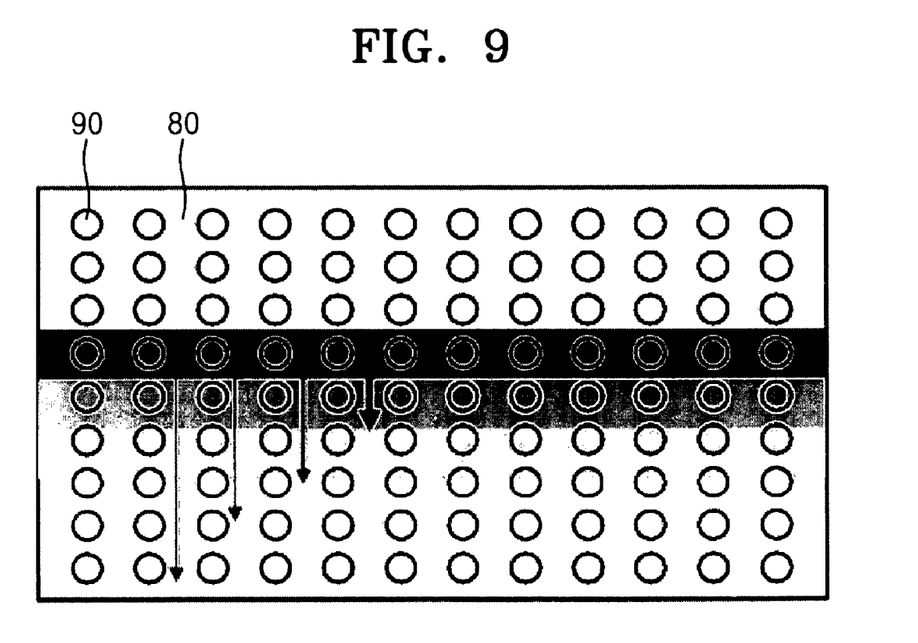
FIG. 9 is a diagram illustrating a spreading range of the light emitted from a lighted light emitting device of a predetermined line, when a light emitting device of the present invention is used as the point light source in the direct light type backlight unit.

FIG. 8 illustrates a dispersion range of light emitted from a general LED 70 lighted in a predetermined domain when a traditional LED 70 is used as a point light source in the backlight unit. FIG. 9 illustrates a dispersion range of light emitted from a light emitting device of the present invention 90 in a predetermined domain when the light emitting device 90 of the present invention is used as a point light source in the direct light type backlight unit. In FIGS. 8 and 9, a plurality of traditional LEDs 70 and a plurality of light emitting devices 90 of the present invention are arranged on base substrates 60 and 80 so as to form a plurality of lines, respectively.

Referring to FIG. 8, when the traditional LED 70 is used, the light emitted from the LED over a predetermined line disperses toward upper and lower directions of the screen, and thus, a color mixture generated due to dispersion of colored light occurs.

However, referring to FIG. 9, when the light emitting device 90 of the present invention is used, the light emitted from the light emitting device of a predetermined line does not proceed toward the previously operated line, in this case the line above the predetermined line. Accordingly, the color mixture generated due to the dispersion of colored light does not occur. Here, one of the light emitting devices according to the above embodiments of the present invention can be used as the light emitting device 90.

Figure 10:
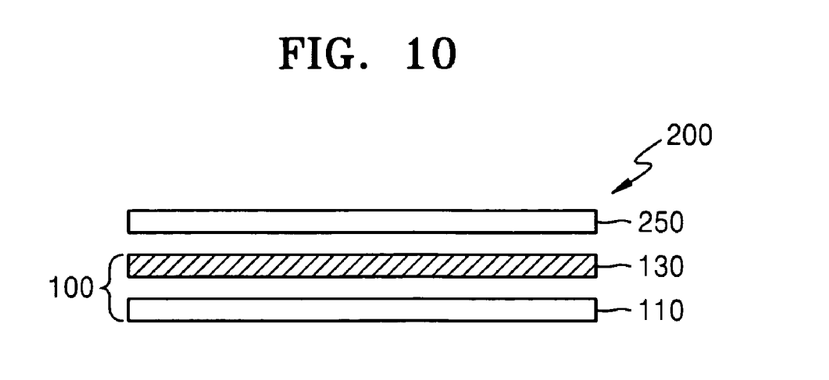
FIG. 10 is a schematic cross-sectional view of the backlight unit including a light emitting device of the present invention and a field sequential LCD apparatus including the backlight unit.
Figure 11:
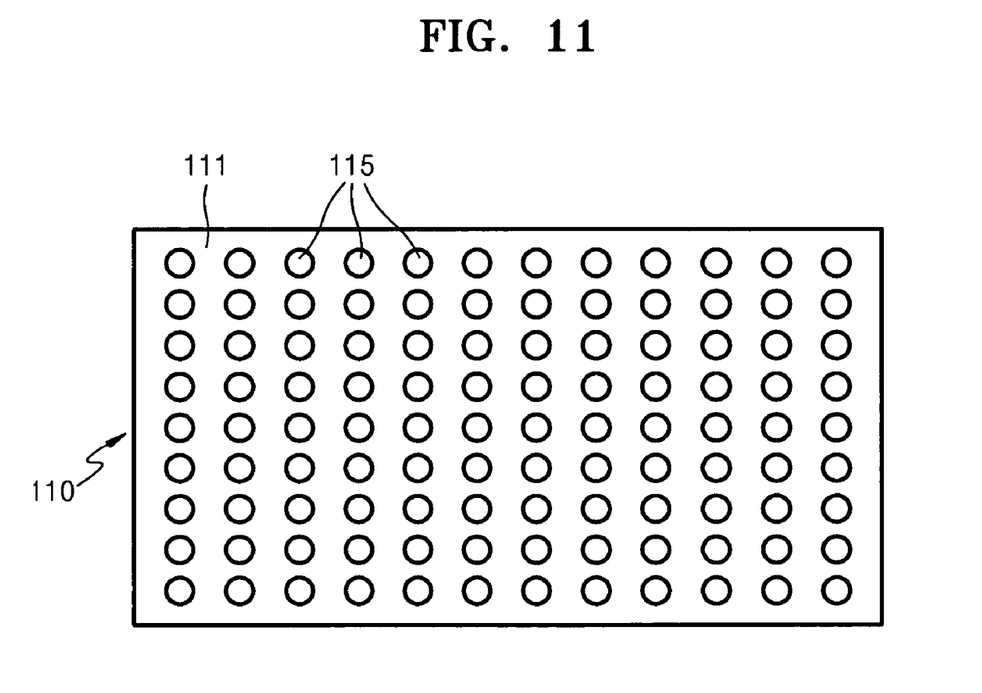
FIG. 11 is a plan view of an arrangement of the light emitting devices of FIG. 10 that form a plurality of lines.

FIG. 10 is a schematic view of a backlight unit 100 including the light emitting device of the present invention and a field sequential LCD apparatus adopting the backlight unit 100 according to an embodiment of the present invention. FIG. 11 is a plan view showing an example of an arrangement of the light emitting devices of FIG. 10 according to an embodiment of the present invention. In the backlight unit 100 the light emitting devices are arranged in a plurality of lines.

Referring to FIG. 10, the backlight unit 100 of the present embodiment is a direct light type backlight unit, and includes light emitting device arrangement 110 and a transmission and diffusion plate 130 disposed on an upper portion of the light emitting device arrangement 110 to diffuse the light incident thereon. In addition, the field sequential LCD apparatus 200 according to an embodiment of the present invention includes a liquid crystal panel 250, and the backlight unit 100 installed on a rear of the liquid crystal panel 250 to irradiate light onto the liquid crystal panel 250.

Referring to FIG. 11, the light emitting device arrangement 110 includes a base substrate 111, and a plurality of light emitting devices 115 arranged on the base substrate 111 as point light sources. The light emitting device 115 may be one of the light emitting devices 10, 20, 30, 40, and 50 according to the above embodiments of the present invention.

The plurality of light emitting devices 115 arranged on the base substrate 111 in the backlight unit 100 are arranged so as to prevent the light emitted from a predetermined domain from proceeding to the previously operated domain in the same frame, when the light emitting devices are divided into a plurality of domains to be sequentially driven.

That is, in a case where the LCD apparatus 200 sequentially drives the light emitting devices from the upper portion of the screen to the lower portion of the screen, the light emitting devices 115 are disposed so that the portion of the outer surface of the lens having the reflective region or the asymmetric region, based on the reference plane p, faces the upper portion of the screen of the LCD apparatus. In addition, in a case where the LCD apparatus 200 drives the light emitting devices sequentially from the lower portion of the screen to the upper portion of the screen, the light emitting devices 15 are disposed so that the portion of the outer surface of the lens having the reflective region or the asymmetric region, based on the reference plane p, faces the lower portion of the screen of the LCD apparatus.

Then, when the domains, in which the plurality of light emitting devices 115 are arranged, sequentially light at predetermined time intervals by the domain unit in synchronization with the scanning time of the liquid crystal panel 250, the light emitted from the light emitting device 115 lighted in a predetermined domain does not proceed to the previously operated domain in the same frame (or the same sub-frame). Accordingly, light emitted from a light emitting device of a predetermined color in a previous sub-frame is not irradiated onto a domain of a following sub-frame in which a scan signal for displaying an image of different color is input. Therefore, color mixture generated due to dispersion of colored light does not occur.

The plurality of light emitting devices 115 arranged on each of the domains of the backlight unit 100 include a single chip emitting the light of a predetermined color, and the plurality of light emitting devices 115 may be disposed on each of the domains so as to emit the R, G, and B lights for displaying the color image.

As shown in FIG. 11, in the backlight unit 100, the plurality of light emitting devices 115 are arranged to form a plurality of lines, and the light emitting devices 115 can separately emit light line by line. In this case, the domain is the line.

The field sequential operation of the LCD apparatus 200 for displaying the color image can be estimated from the description with reference to FIGS. 1 and 2, and thus, detailed description about the operation will be omitted.

In the above description, the light emitting device of the present invention is applied to the direct light type backlight unit, however, the present invention is not limited thereto. That is, the light emitting device of the present invention can be used as the light source of an edge light type backlight unit.

According to a light emitting device of the present invention, the light emitted from a light emitting device of a predetermined domain is not transmitted to the previously operated domains in the same frame, or sub-frame, when the two-dimensional arrangement of the light emitting devices is divided into the plurality of domains to sequentially operate the light emitting devices. Therefore, when the light emitting device of the present invention is used as the light source of the backlight unit in the field sequential LCD apparatus, the degrading of color reproduction due to dispersion of colored light between the domains can be prevented and the color unevenness of the entire screen can be removed.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A light emitting device comprising:
   a light emitting element chip; and
   a lens which asymmetrically transmits light generated by the light emitting element chip,
   wherein the lens comprises a reflective region, which reflects incident light, disposed on half of an outer surface of the lens that is located on a first side of a reference plane including a central axis of the light emitting element chip and the lens, and thereby asymmetrically transmits light generated by the light emitting element chip.

2. The light emitting device of claim 1, wherein the lens further comprises a light transmission region, which refracts and transmits light, wherein the light transmission region is located on half of the outer surface of the lens that is located on a second side of the reference plane opposite the first side.

3. A light emitting device comprising:
   a light emitting element chip; and
   a lens which asymmetrically transmits light generated by the light emitting element chip,
   wherein the lens comprises a reflective region, which reflects incident light, disposed on at least a portion of an outer surface of the lens, wherein the reflective region is located on a side of a reference plane including a central axis of the light emitting element chip and the lens, and thereby asymmetrically transmits light generated by the light emitting element chip, and
   wherein the reflective region has a reflectivity gradient.

4. The light emitting device of claim 3, wherein the reflective region has a larger reflectivity at portions of the reflective region further from the reference plane, as compared to portions of the reflective region closer to the reference plane.

5. The light emitting device of claim 4, wherein the reflective region comprises a reflective pattern coated on the surface of the lens, and the reflective pattern is denser on portions of the surface of the lens farther from the reference plane, as compared to portions of the surface of the lens closer to the reference plane, thereby forming the reflectivity gradient.

6. A backlight unit comprising:
   a base substrate;
   a plurality of point light sources arranged on the base substrate; and
   a transmission and diffusion plate, disposed on the plurality of point light sources, which diffuses and transmits incident light,
   wherein each of the plurality of point light sources comprises:
   a light emitting element chip; and
   a lens which asymmetrically transmits light generated by the light emitting element chip, which prevents light emitted from the light emitting element chip from proceeding in a predetermined direction,
   wherein the lens comprises a reflective region, which reflects incident light, disposed on half of an outer surface of the lens that is located on a first side of a reference plane including a central axis of the light emitting element chip and the lens, and thereby asymmetrically transmits light generated by the light emitting element chip.

7. The backlight unit of claim 6, wherein the plurality of point light sources arranged on the base substrate are divided into domain regions, wherein each of the domain regions includes a single light emitting element chip which emits one of red, green, and blue light.

8. The backlight unit of claim 6, wherein each domain region comprises a line of point light sources.

9. The backlight unit of claim 6, wherein the lens further comprises a light transmission region, which refracts and transmits light, wherein the light transmission region is located on half of the outer surface of the lens that is located on a second side of the reference plane opposite the first side.

10. A backlight unit comprising:
    a base substrate;
    a plurality of point light sources arranged on the base substrate; and
    a transmission and diffusion plate, disposed on the plurality of point light sources, which diffuses and transmits incident light,
    wherein each of the plurality of point light sources comprises:
    a light emitting element chip; and
    a lens which asymmetrically transmits light generated by the light emitting element chip, which prevents light emitted from the light emitting element chip from proceeding in a predetermined direction,
    wherein the lens comprises a reflective region, which reflects incident light, disposed on at least a portion of an outer surface of the lens, wherein the reflective region is located on a side of a reference plane including a central axis of the light emitting element chip and the lens, and thereby asymmetrically transmits the light generated by the light emitting element chip, and
    wherein the reflective region has a reflectivity gradient.

11. The backlight unit of claim 10, wherein the reflective region has a larger reflectivity at portions of the reflective region further from the reference plane, as compared to portions of the reflective region closer to the reference plane.

12. The backlight unit of claim 11, wherein the reflective region comprises a reflective pattern coated on the surface of the lens, and the reflective pattern is denser on portions of the surface farther from the reference plane, as compared to portions of the surface of the lens closer to the reference plane, thereby forming the reflectivity gradient.

13. A field sequential display apparatus comprising:
    a display panel; and
    a backlight unit, installed on a rear of the display panel, which irradiates light onto the display panel,
    wherein the backlight unit comprises:
    a base substrate;

a plurality point light sources arranged on the base substrate; and a transmission and diffusion plate disposed on the plurality point light sources, which diffuses and transmits incident light, wherein each of the plurality of point light sources comprises:

a light emitting element chip; and a lens which asymmetrically transmits light generated by the light emitting element chip, which prevents light emitted from the light emitting element chip from proceeding in a predetermined direction, wherein the lens comprises a reflective region, which reflects incident light, disposed on half of an outer surface of the lens that is located on a first side of a reference plane including a central axis of the light emitting element chip and the lens, and thereby asymmetrically transmits light generated by the light emitting element chip.

14. The field sequential display apparatus of claim 13, wherein the plurality of point light sources arranged on the base substrate are divided into domain regions, wherein each of the domain regions includes a single light emitting element chip which emits one of red, green, and blue light.

15. The field sequential display apparatus of claim 13, wherein each domain region comprises a line of point light sources.

16. The field sequential display apparatus of claim 13, wherein the display panel is a liquid crystal panel.

17. The field sequential display apparatus of claim 13, wherein the lens further comprises a light transmission region, which refracts and transmits light, wherein the light transmission region is located on half of the outer surface of the lens that is located on a second side of the reference plane opposite the first side.

18. A field sequential display apparatus comprising:
a display panel; and
a backlight unit, installed on a rear of the display panel, which irradiates light onto the display panel, wherein the backlight unit comprises:

a base substrate;

a plurality point light sources arranged on the base substrate; and a transmission and diffusion plate disposed on the plurality point light sources, which diffuses and transmits incident light, wherein each of the plurality of point light sources comprises:

a light emitting element chip; and a lens which asymmetrically transmits light generated by the light emitting element chip, which prevents light emitted from the light emitting element chip from proceeding in a predetermined direction, wherein the lens comprises a reflective region, which reflects incident light, disposed on at least a portion of an outer surface of the lens, wherein the reflective region is located on a side of a reference plane including a central axis of the light emitting element chip and the lens, and thereby asymmetrically transmits the light generated by the light emitting element chip, and wherein the reflective region has a reflectivity gradient.

19. The field sequential display apparatus of claim 18, wherein the reflective region has a larger reflectivity at portions of the reflective region further from the reference plane, as compared to portions of the reflective region closer to the reference plane.

20. The field sequential display apparatus of claim 19, wherein the reflective region comprises a reflective pattern coated on the surface of the lens, and the reflective pattern is denser on portions of the surface farther from the reference plane, as compared to portions of the surface of the lens closer to the reference plane, thereby forming the reflectivity gradient.

* * * * *

UNITED STATES PATENT AND TRADEMARK OFFICE
CERTIFICATE OF CORRECTION

| | | |
|---|---|---|
| PATENT NO. | : 7,655,955 B2 | Page 1 of 1 |
| APPLICATION NO. | : 11/591524 | |
| DATED | : February 2, 2010 | |
| INVENTOR(S) | : Il-yong Jung | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 157 days.

Signed and Sealed this

Twenty-eighth Day of December, 2010

David J. Kappos
*Director of the United States Patent and Trademark Office*